(12) United States Patent
Yao et al.

(10) Patent No.: US 10,627,425 B2
(45) Date of Patent: Apr. 21, 2020

(54) WORKBENCH FOR MOUNTING ELECTRICAL FUNCTION TEST UNIT

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventors: Huazhong Yao, Beijing (CN); Hongyan Guo, Beijing (CN); Yoseop Cheong, Beijing (CN); Yang Yu, Beijing (CN); Huailiang Wu, Beijing (CN); Yong Wang, Beijing (CN); Zongtian Xie, Beijing (CN); Zengyang Jiang, Beijing (CN); Cundui Tang, Beijing (CN); Panpan Cai, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

( * ) Notice: Subject to any disclaimer, the term of this patent is extended or adjusted under 35 U.S.C. 154(b) by 96 days.

(21) Appl. No.: 15/966,222

(22) Filed: Apr. 30, 2018

(65) Prior Publication Data

US 2019/0041426 A1 Feb. 7, 2019

(30) Foreign Application Priority Data

Aug. 7, 2017 (CN) .......................... 2017 1 0667001

(51) Int. Cl.
*G01R 1/04* (2006.01)
(52) U.S. Cl.
CPC ..................................... *G01R 1/04* (2013.01)

(58) Field of Classification Search
CPC .......... G02F 1/1309; B25H 1/02; B25B 11/00
See application file for complete search history.

(56) References Cited

U.S. PATENT DOCUMENTS 4,859,992 A * 8/1989 Hoigaard ............... G01R 27/20
340/649
5,318,284 A 6/1994 Demmeler et al.
(Continued)

FOREIGN PATENT DOCUMENTS

CN 201950656 U 8/2011
CN 103963035 A 8/2014
(Continued)

OTHER PUBLICATIONS

First Office Action for Chinese Patent Application No. 201710667001.5 dated Apr. 8, 2019.

*Primary Examiner* — Thang X Le
*Assistant Examiner* — Alvaro E Fortich
(74) *Attorney, Agent, or Firm* — Calfee, Halter & Griswold LLP

(57) ABSTRACT

A workbench for mounting an electrical function test unit includes: a mounting surface for mounting the electrical function test unit, wherein the mounting surface is provided with a connecting area, and a number of mounting through holes are arranged in the connecting area; and connectors detachably connected with the mounting through holes and configured to match with mounting screws of the electrical function test unit when the electrical function test unit is mounted on the workbench. The workbench has long service life, reduces the replacement difficulty of the electrical function test unit and shortens the downtime, thereby improving the detection efficiency of the display screen.

16 Claims, 2 Drawing Sheets

(56) References Cited

U.S. PATENT DOCUMENTS

| | | | | |
|---|---|---|---|---|
| 5,901,763 | A | * | 5/1999 | You .................. B23D 47/025 144/286.1 |
| 7,549,233 | B2 | * | 6/2009 | Zhang .................. G01B 7/30 33/1 N |
| 2006/0290371 | A1 | * | 12/2006 | Yang .................. G01R 31/01 324/754.08 |
| 2010/0050781 | A1 | * | 3/2010 | Zhang .................. G01N 3/00 73/831 |

FOREIGN PATENT DOCUMENTS

| | | |
|---|---|---|
| CN | 205660338 U | 10/2016 |
| DE | 202009014342 U1 | 4/2011 |
| EP | 647499 A2 | 4/1995 |

* cited by examiner

WORKBENCH FOR MOUNTING ELECTRICAL FUNCTION TEST UNIT

RELATED APPLICATION

This application claims priority to Chinese patent application number 201710667001.5 filed on Aug. 7, 2017, the entire content of which is incorporated herein by reference.

FIELD OF THE DISCLOSURE

The present disclosure relates to a technical field of display devices and liquid crystal detection, and in particular to a workbench for mounting an electrical function test unit.

BACKGROUND OF THE DISCLOSURE

Auto probe (AP) is an electrical function test machine, which is used to load signals to a display screen to detect defects on the display screen. It is mainly used in flat display panel manufacturing industry such as a liquid crystal display panel, a plasma display panel, an organic electroluminescence display panel and so on. The probe unit (PU) is an electrical function test unit, which is a core functional component of AP device. It is usually fixed on a workbench of the electrical function test machine by threaded connection.

However, when performing electrical function tests on different models of display screens, tests are performed by loading specific test signals by replacing the different models of electrical function test units through replacement operations. Frequent replacement of the electrical function test units will cause the threaded hole of the workbench to be damaged (e.g. thread slipping), thus causing the PU to become loose and affecting the normal operation of the device. There are two existing solutions: one is to replace the workbench, but the workbench is large in volume and high in replacement cost; the other is to use special tools to directly trim or rebuild the thread in the threaded hole. However, because of the small aperture of the threaded hole in the workbench, using special tools to trim or rebuild the thread in the threaded hole will cause problems such as long time consuming and low success rate.

SUMMARY OF THE DISCLOSURE

The present disclosure provides a workbench for mounting an is electrical function test unit, comprising:

a mounting surface for mounting the electrical function test unit, wherein the mounting surface is provided with a connecting area, and a plurality of mounting through holes are arranged in the connecting area;

connectors detachably connected with the mounting through holes and configured to match with the mounting screws of the electrical function test unit when the electrical function test unit is mounted on the workbench.

According to an aspect of the present disclosure, each of the mounting through holes is provided with one connector.

According to an aspect of the present disclosure, the connector is provided with an external thread, and the connector is in threaded connection with the mounting through hole.

According to an aspect of the present disclosure, the connector is provided with an internal thread, the external thread and the internal thread having opposite helical directions. For example, the internal thread of the connector is a right-handed thread and the external thread of the connector is a left-handed thread or vice versa.

According to an aspect of the present disclosure, the connector is inserted into the mounting through hole.

According to an aspect of the present disclosure, an outer periphery of the connector forms an interference fit with the mounting through hole.

According to an aspect of the present disclosure, the connector is in clearance fit with the mounting through hole and the outer periphery of the radial cross section of the connector is in a regular hexagonal shape along the extending direction of the mounting surface, and the radial cross section of the mounting through hole is in a regular hexagonal shape corresponding to the shape of the outer periphery of the radial cross section of the connector.

According to an aspect of the present disclosure, a head of the connector is disposed at a side of the workbench facing away from the mounting surface.

According to an aspect of the present disclosure, the mounting through hole is provided with internal thread, and when mounting, the tightening force between the internal thread of the mounting through hole and the external thread of the connector is greater than the tightening force between the internal thread of the connector and the mounting screw of the electrical function test unit.

According to an aspect of the present disclosure, an end face of the connector facing the mounting surface does not extend beyond the mounting surface.

According to an aspect of the present disclosure, an end face of the connector facing away from the mounting surface does not extend beyond a surface of the workbench facing away from the mounting surface.

According to an aspect of the present disclosure, the connector is provided with an internal thread, and the static friction force of the interference fit between the outer periphery of the connector and the mounting through hole is greater than the screwing force between the mounting screw and the internal thread of the connector.

Another aspect of the present disclosure also provides an electrical function test machine including an electrical function test unit and the workbench according to any one of the above aspects.

DETAILED DESCRIPTION OF THE DISCLOSURE

Figure 1:
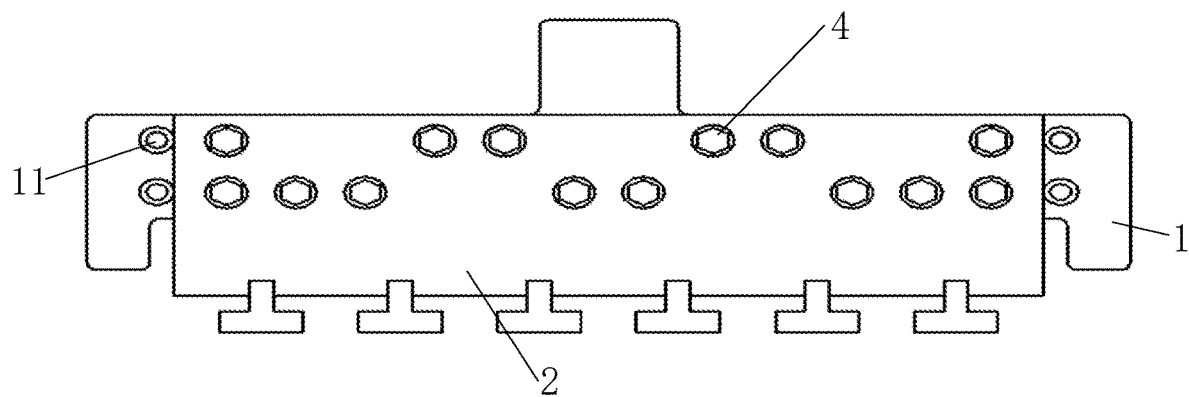
FIG. 1 is a front view of a workbench after an electrical function test unit is mounted according to an embodiment of the is present disclosure.
Figure 2:
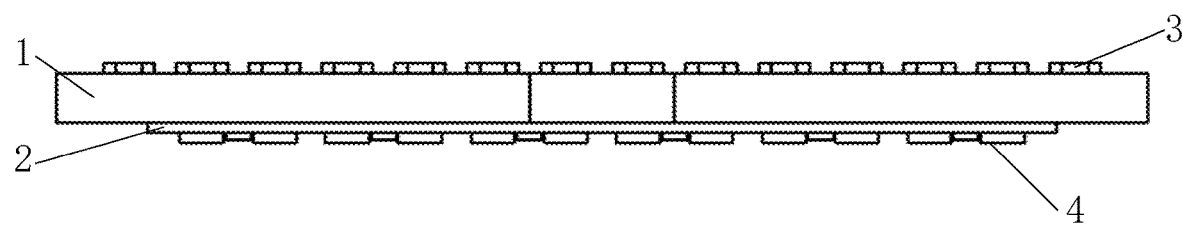
FIG. 2 is a top view of the workbench after the electrical function test unit is mounted according to the embodiment of the present disclosure.
Figure 3:
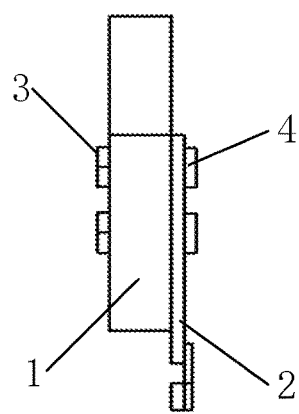
FIG. 3 is a side view of the workbench after the electrical function test unit is mounted according to the embodiment of the present disclosure.
Figure 4:
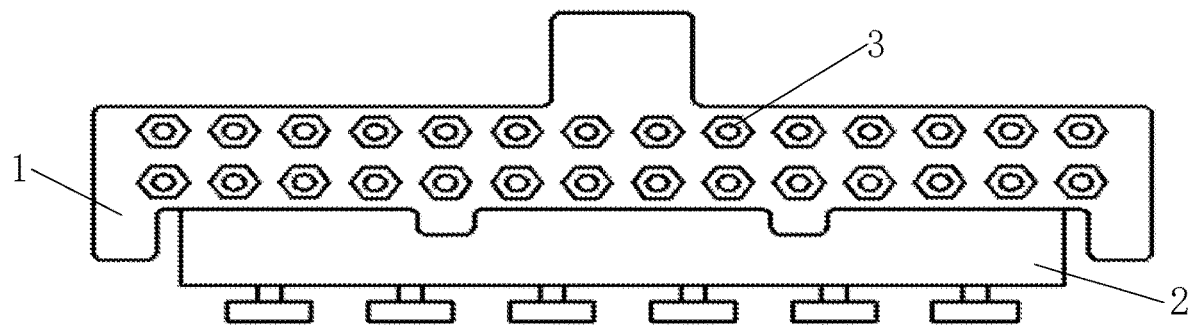
FIG. 4 is a rear view of the workbench after the electrical function test unit is mounted according to the embodiment of the present disclosure.

Hereinafter, the technical solutions in the embodiments of the present disclosure will be described clearly and completely with reference to the drawings in the embodiments of the present disclosure. Obviously, the described embodiments are only a part of the embodiments of the present disclosure, and not all of the embodiments. Based on the embodiments of the present disclosure, all other embodiments obtained by one of ordinary skill in the art without creative efforts are within the scope of the present disclosure.

The present disclosure provides a workbench 1 for mounting an electrical function test unit, comprising:

a mounting surface for mounting the electrical function test unit 2, wherein the mounting surface is provided with a connecting area, and a plurality of mounting through holes 11 are arranged in the connecting area;

connectors detachably connected with the mounting through holes 11 and configured to match with the mounting screws 4 of the electrical function test unit 2 when the electrical function test unit 2 is mounted on the workbench.

In the workbench 1 for mounting the electrical function test unit according to an embodiment of the present disclosure, the problem of thread slipping of the mounting through holes of the workbench in the prior art can be solved by adding the use of the connectors 3, and this is advantageous to prolong the service life of the workbench 1.

In the aforesaid workbench for mounting the electrical function test unit, the connectors 3 are detachably mounted in the mounting through holes 11 of the workbench. Referring to FIGS. 1 to 4, when the electrical function test unit 2 needs to be mounted on the workbench 1, the mounting screws 4 of the electrical function test unit 2 are screwed into the internal threaded holes of the connectors 3 and the electrical function test unit 2 is fixed to the workbench by engaging the external thread of the screws 4 with the internal thread in the internal threaded holes of the connectors 3. When it is necessary to detach the electrical function test unit 2 from the workbench 1, the mounting screws 4 of the electrical function test unit 2 can be simply unscrewed from the internal thread of the connectors 3. The above-mentioned connectors 3 make the mounting and detaching processes of the electrical function test unit 2 to and from the workbench 1 provided by the present disclosure simple and easy to operate. When detaching and mounting the electrical function test unit 2 with respect to the workbench 1 for many times causes slipping of the internal thread of the connector 3, only the connector 3 detachably connected to the workbench 1 needs to be replaced, so that complex operation (such as trimming or rebuilding the damaged internal thread) to the mounting through hole 11 in the workbench 1 by using special tools is avoided, therefore the mounting through hole 11 in the workbench 1 is protected, the service life of the workbench 1 is prolonged, the replacement difficulty is reduced, the down time is shortened, a large amount is of device maintenance capital investment is saved, the workload of maintenance personnel is reduced, and the detection efficiency of the display screen can be improved.

Therefore, by adding the use of the connectors 3, the problem that the internal thread of the mounting through hole 11 of the working workbench 1 is easy to slip can be solved, and this is beneficial to prolong the service life of the working workbench 1.

On the basis of the above technical solution, each mounting through hole 11 is provided with a connector 3.

Specifically, when the electrical function test units 2 of different models are replaced, if the corresponding mounting through holes 11 for each model of the electrical function test units 2 in the connecting area are different, since each mounting hole in the connecting area is provided with a connector 3, the electrical function test units 2 to be mounted can be directly mounted by selecting different mounting through holes 11.

Figure 5:
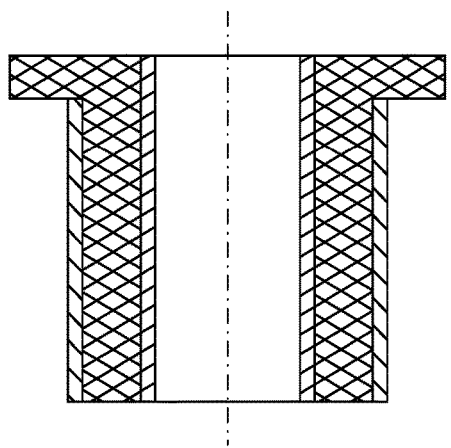
FIG. 5 is a schematic structural view of a connector provided by an embodiment of the present disclosure.

It should be noted that the detachable connection structure between the connector 3 and the mounting through hole 11 has a variety of possibilities, at least one of the following:

A first structure 1: referring to FIG. 5, as an exemplary embodiment, the connector 3 is provided with external thread and the connection between the connector 3 and the mounting through hole 11 is threaded connection.

It should be noted that the threaded connection structure adopted by the connector 3 and the workbench 1 has the advantages of simple structure, reliable connection, convenient disassembly and assembly, and the like.

On the basis of the technical solution in the first structure, the connector 3 is detachably mounted in the internal thread of the mounting through hole 11 of the workbench 1 through its external thread.

When the operation of replacing the electrical function test unit 2 a plurality of times causes the internal thread of the connector 3 to slip, only the connector 3 on the workbench 1 needs to be replaced. At this time, only the connector 3 mounted on the workbench 1 needs to be disassembled through the external thread of the connector 3, so that the replacement speed can be accelerated, the replacement difficulty can be reduced, the downtime can be shortened, and the detection efficiency of the display screen can be improved.

On the basis of the above technical solution, according to an aspect of the present disclosure, the internal thread of the connector 3 are right-handed thread and the external thread of the connector 3 are left-handed thread. Of course, it is also possible that the internal thread of the connector 3 are left-handed thread and the external thread of the connector 3 are right-handed thread. As long as the helical directions of the internal and external thread of the connector 3 are opposite to each other.

Specifically, the internal thread are right-handed thread and the external thread are left-handed thread. When the electrical function test unit 2 is to be mounted on the workbench 1, the mounting screw 4 on the electrical function test unit 2 needs to be tightened. Since the helical directions of the internal thread and external thread of the connector 3 are opposite, the tightening degree (or tightening force) between the connector 3 and the mounting through hole 11 of the workbench 1 is increased, that is, the tightening degree between the external thread of the connector and the mounting through hole 11 is increased to achieve interlocking action. When the electrical function test unit 2 is to be detached from the workbench 1, the mounting screw 4 on the electrical function test unit 2 needs to be unscrewed. Since the tightening degree (or tightening force) between the workbench 1 and the external thread of the connector 3 is greater than the tightening degree (or tightening force) between the internal thread is of the connector 3 and the mounting screw 4 on the electrical function test unit 2, the connection between the internal thread of the connector 3 and the mounting screw 4 on the electrical function test unit 2 is preferentially unscrewed without affecting the connection between the connector 3 and the workbench 1.

It should be noted that, as can be seen from the above analysis, the electrical function test units 2 need to be replaced frequently for the purpose of testing. In the process of repeatedly screwing the mounting screw 4 on the internal thread of the connector 3 for fixing the electrical function test unit 2, the internal thread of the connector 3 are constantly rubbed, so that the phenomenon of slipping caused by abrasion easily occurs, and the screwing operation between the connector 3 and the mounting through hole 11 of the workbench 1 is less, so that the thread loss in the mounting through hole 11 of the workbench 1 is small, and thus the service life of the workbench 1 can be prolonged.

A second structure: the connector 3 is inserted into the mounting through hole 11.

It should be noted that this connection method simplifies the structure of the connector 3 and the workbench 1 and can reduce the manufacturing and maintenance costs.

The connector 3 is inserted into the mounting through hole 11 in a variety of configurations, and the configurations are at least one of the following:

A first exemplary configuration: the outer periphery of the connector 3 forms an interference fit with the mounting through hole 11.

It should be noted that when the electrical function test unit 2 is to be mounted to or detached from the workbench 1, the mounting screw 4 on the electrical function test unit 2 needs to be tightened or unscrewed. Since the static friction force of the interference fit between the outer periphery of the connector 3 and is the mounting through hole 11 is greater than the tightening force or unscrewing force between the mounting screw 4 and the internal thread of the connector 3, the connector 3 does not rotate with respect to the mounting through hole 11 of the workbench 1 when the mounting screw 4 is screwed with respect to the connector 3. Therefore, when the mounting screw 4 on the electrical function test unit 2 is screwed in or out with respect to the internal thread of the connector 3, the connection between the connector 3 and the workbench 1 is not affected.

A second exemplary configuration: the connector 3 is in a clearance fit with the mounting through hole 11. In the extending direction of the mounting surface of the workbench 1, the outer periphery of the radial cross section of the connector 3 has a regular hexagonal shape, and the radial cross section of the mounting through hole 11 has a shape corresponding to the shape of the outer periphery of the radial cross section of the connector 3.

It should be noted that when the electrical function test unit 2 is to be mounted on the workbench 1, and when the mounting screw 4 on the electrical function test unit 2 needs to be tightened or unscrewed, the connector 3 does not rotate with respect to the mounting through hole 11 of the workbench 1 when the mounting screw 4 is screwed with respect to the connector 3 because the outer periphery of the radial cross-section of the connector 3 has a regular hexagonal shape and the radial cross-section of the mounting through hole 11 has a shape corresponding to the shape of the outer periphery of the radial cross-section of the connector 3 and the hexagonal structure of the outer periphery of the connector 3 is inserted into the corresponding hexagonal structure of the mounting through hole 11. Therefore, when the mounting screw 4 on the electrical function test unit 2 is screwed in or out with respect to the internal thread of the connector 3, the is connection between the connector 3 and the workbench 1 is not affected.

As can be seen from that technical solutions in the above-described first exemplary configuration and the above-described second exemplary configuration, in the process of repeatedly rotating the mounting screw 4 on the internal thread of the connector 3 for fixing the electrical function test unit 2, the internal thread of the connector 3 are continuously rubbed, and the phenomenon of slippage due to abrasion easily occurs, but the connection between the connector 3 and the mounting through hole 11 of the workbench 1 is not affected, so that the loss of the inner surface of the mounting through hole 11 of the workbench 1 is small, and the service life of the workbench 1 can be prolonged. Moreover, when the connector 3 needs to be replaced, only the connector 3 on the workbench 1 needs to be detached, and the operation is simple.

In the second exemplary configuration, it is also possible to design only the outer peripheral shape of the radial cross section of the head of the connector 3, which is located at the side of the workbench 1 facing away from the mounting surface, to be regular hexagonal (the outer contour shape of the connector 3 is similar to that of a countersunk screw). Accordingly, the side of the mounting through hole 11 facing away from the mounting surface has a regular hexagonal groove corresponding to the shape of the outer contour of the head (the contour shape of the mounting through hole 11 corresponds to a shape similar to a countersunk screw).

It should be noted that the head of the connector 3 is located at the side of the workbench 1 facing away from the mounting surface of the electrical function test unit 2, and this structure allows the mounting surface of the workbench 1 to be fitted with the mounting surface of the electrical function test unit 2 when is the electrical function test unit 2 is snugly fixed to the workbench 1 using screws, thereby ensuring the flatness requirement.

On the basis of the above technical solutions, the end face of the connector 3 facing the mounting surface does not extend beyond the mounting surface.

It should be noted that the configuration in which the end face of the connector 3 facing the mounting surface does not extend beyond the mounting surface is such that, in a state where the electrical function test unit 2 is tightened with respect to the workbench 1, the end portion of the connector 3 is at a certain distance from the mounting surface of the workbench 1, and at this time, the electrical function test unit 2 will be in close contact with the mounting surface of the workbench 1 without causing the rod portion of the connector 3 to be excessively long or a bulge phenomenon caused by the tip of the rod portion jacking up the electrical function test unit 2, thereby ensuring the flatness requirement on the other hand.

On the basis of the above technical solution, an end face of the connector 3 facing away from the mounting surface does not extend beyond the surface of the workbench 1 facing away from the mounting surface.

It should be noted that this configuration ensures the flatness of a surface of the workbench 1 facing away from the mounting surface and facilitates other operations in this plane of the workbench 1.

It will be apparent to those skilled in the art that various variations and modifications may be made to the embodiments of the present disclosure without departing from the spirit and scope of the disclosure. Thus, it is intended that the present disclosure also encompass such modifications and variations as fall within the scope of the appended claims and their equivalents.

The invention claimed is:

1. A workbench for mounting an electrical function test unit, comprising:
   a mounting surface for mounting the electrical function test unit, wherein the mounting surface is provided with a connecting area, and a plurality of mounting through holes are arranged in the connecting area; and
   connectors detachably connected with the mounting through holes and configured to match with mounting screws of the electrical function test unit when the electrical function test unit is mounted on the workbench;

wherein each of the mounting through holes is provided with one of the connectors; and wherein each connector is in clearance fit with each corresponding mounting through hole and an outer periphery of a radial cross section of each connector is in a regular hexagonal shape along an extending direction of the mounting surface, and a radial cross section of each corresponding mounting through hole is in a regular hexagonal shape corresponding to the shape of the outer periphery of the radial cross section of the connector.

2. The workbench according to claim 1, wherein each connector is provided with external thread, and each connector is in threaded connection with each corresponding mounting through hole.

3. The workbench according to claim 2, wherein each connector is provided with internal thread, the external thread and the internal thread having opposite helical directions.

4. The workbench according to claim 1, wherein each connector is inserted into each corresponding mounting through hole.

5. The workbench according to claim 4, wherein the outer periphery of the radial cross section of each connector forms an interference fit with each corresponding mounting through hole.

6. The workbench according to claim 4, wherein each mounting through hole is provided with an internal thread, and when mounting, a tightening force between the internal thread of each mounting through hole and the external thread of each connector is greater than a tightening force between the internal thread of each connector and each mounting screw of the electrical function test unit.

7. The workbench according to claim 6, wherein an end face of each connector facing the mounting surface does not extend beyond the mounting surface.

8. The workbench according to claim 7, wherein an end face of each connector facing away from the mounting surface does not extend beyond a surface of the workbench facing away from the mounting surface.

9. The workbench according to claim 5, wherein each connector is provided with an internal thread, and a static friction force of the interference fit between the outer periphery of the radial cross section of each connector and each mounting through hole is greater than a screwing force between each mounting screw and the internal thread of each connector.

10. An electrical function test machine comprising an electrical function test unit and a workbench for mounting the electrical function test unit, wherein the workbench comprises:

a mounting surface for mounting the electrical function test unit, wherein the mounting surface is provided with a connecting area, and a plurality of mounting through holes are arranged in the connecting area;

connectors detachably connected with the mounting through holes and configured to match with mounting screws of the electrical function test unit when the electrical function test unit is mounted on the workbench;

wherein each of the mounting through holes is provided with one of the connectors; and wherein each connector is in clearance fit with each corresponding mounting through hole and an outer periphery of a radial cross section of each connector is in a regular hexagonal shape along an extending direction of the mounting surface, and a radial cross section of each corresponding mounting through hole is in a regular hexagonal shape corresponding to the shape of the outer periphery of the radial cross section of the connector.

11. The electrical function test machine according to claim 10, wherein each connector is provided with an external thread, and each connector is in threaded connection with each corresponding mounting through hole.

12. The electrical function test machine according to claim 11, wherein each connector is provided with an internal thread, and an external thread and the internal thread have opposite helical directions.

13. The electrical function test machine according to claim 10, wherein each connector is inserted into each corresponding mounting through hole.

14. The electrical function test machine according to claim 13, wherein each connector is in interference fit with each corresponding mounting through hole.

15. The electrical function test machine according to claim 12, wherein each mounting through hole is provided with an internal thread, and a tightening force between the internal thread of each mounting through hole and the external thread of each connector is greater than a tightening force between the internal thread of each connector and each mounting screw of the electrical function test unit during mounting.

16. The electrical function test machine according to claim 14, wherein each connector is provided with an internal thread, and a static friction force of the interference fit between the outer periphery of the radial cross section of each connector and each corresponding mounting through hole is greater than a screwing force between each mounting screw and the internal thread of each connector.

* * * * *